(12) United States Patent
Gogoi et al.

(10) Patent No.: US 6,916,728 B2
(45) Date of Patent: Jul. 12, 2005

(54) METHOD FOR FORMING A SEMICONDUCTOR STRUCTURE THROUGH EPITAXIAL GROWTH

(75) Inventors: Bishnu Gogoi, Scottsdale, AZ (US); Raymond M. Roop, Scottsdale, AZ (US)

(73) Assignee: Freescale Semiconductor, Inc., Schaumburg, IL (US)

( * ) Notice: Subject to any disclaimer, the term of this patent is extended or adjusted under 35 U.S.C. 154(b) by 0 days.

(21) Appl. No.: 10/328,923

(22) Filed: Dec. 23, 2002

(65) Prior Publication Data

US 2004/0119125 A1 Jun. 24, 2004

(51) Int. Cl.$^7$ .............................................. H01L 21/22
(52) U.S. Cl. ...................................... 438/481; 438/977
(58) Field of Search .................................. 438/52, 481

(56) References Cited

U.S. PATENT DOCUMENTS

| | | | |
|---|---|---|---|
| 5,258,097 A | 11/1993 | Mastrangelo | 156/644 |
| 5,310,450 A | 5/1994 | Offenberg et al. | 156/630 |
| 5,576,250 A | 11/1996 | Diem et al. | 437/228 |
| 5,616,514 A | 4/1997 | Muchow et al. | 438/50 |
| 5,616,523 A | 4/1997 | Benz et al. | 438/50 |
| 5,750,420 A | 5/1998 | Bono et al. | 428/52 |
| 5,937,275 A | 8/1999 | Munzel et al. | 438/50 |
| 5,959,208 A | 9/1999 | Muenzel et al. | 73/514.32 |
| 6,030,850 A | 2/2000 | Kurle et al. | 438/48 |
| 6,055,858 A | 5/2000 | Muenzel et al. | 73/504.12 |
| 6,401,536 B1 | 6/2002 | O'Brien et al. | 73/514.38 |
| 6,524,878 B2 * | 2/2003 | Abe et al. | 438/52 |
| 2003/0060051 A1 * | 3/2003 | Kretschmann et al. | 438/694 |

OTHER PUBLICATIONS

James M. Bustillo, Robert T. Howe, "Surface Micromachining for Microelectromechanical Systems", Proceedings of the IEEE, vol. 86, No. 8 (Aug. 1998).
U.S. Appl. No. 10/238,062, filed Sep. 9, 2002, O'Brien et al.

* cited by examiner

Primary Examiner—W. David Coleman
(74) Attorney, Agent, or Firm—John A. Fortkort; Fortkort Grether + Kelton LLP

(57) ABSTRACT

A method for creating a MEMS structure is provided. In accordance with the method, an article is provided which comprises a substrate (101) and a single crystal semiconductor layer (105), and having a sacrificial layer (103) comprising a first dielectric material which is disposed between the substrate and the semiconductor layer. An opening (107) is created which extends through the semiconductor layer (105) and the sacrificial layer (103) and which exposes a portion of the substrate (101). An anchor portion (109) comprising a second dielectric material is then formed in the opening (107). Next, the semiconductor layer (105) is epitaxially grown to a suitable device thickness, thereby forming a device layer (111).

41 Claims, 3 Drawing Sheets

US 6,916,728 B2

METHOD FOR FORMING A SEMICONDUCTOR STRUCTURE THROUGH EPITAXIAL GROWTH

FIELD OF THE INVENTION

The present invention relates generally to microfabrication techniques, and more particularly to methods for making semiconductor structures such as MEMS devices.

BACKGROUND OF THE INVENTION

Advancements in micromachining and other microfabrication techniques and processes have enabled the fabrication of a wide variety of MicroElectroMechanical Systems (MEMS) and devices. These include moving rotors, gears, switches, accelerometers, miniaturized sensors, actuator systems, and other such structures.

One popular approach for forming MEMS devices makes use of a modified wafer known as a Silicon-On-Insulator (SOI) wafer. An SOI wafer is essentially a silicon handle wafer having a silicon dioxide sacrificial layer disposed thereon, and having a device layer of active single-crystalline silicon disposed on the sacrificial layer. FIGS. 1–3 illustrate a conventional method for creating a MEMS structure on an SOI wafer. As shown in FIG. 1, in accordance with this method, a silicon wafer substrate 15 is provided having a silicon dioxide sacrificial layer 13 disposed thereon. A layer of active single crystal silicon 11 is disposed over the sacrificial layer. The layer of active single-crystal silicon is then masked, patterned and selectively etched to yield the structure shown in FIG. 2, after which the sacrificial layer is partially removed by selective chemical etching to release the structure. As shown in FIG. 3, the released MEMS structure 12 has a cantilevered portion 17 formed of Si and an anchor portion 19 formed of $SiO_2$.

The methodology depicted in FIGS. 1–3 suffers from a number of drawbacks, one being its reliance on partial chemical etching to define the anchor structure perimeter. Chemical etch rates can vary considerably from one product lot to another in an SOI fabrication scheme, due, for example, to variations in temperature, in the pH of the etching solution, and in the composition of the dielectric material being etched. In a fabrication scheme which relies on partial chemical etching, these variations in etch rates result in variations in the size of the anchor perimeter of the device. Consequently, in order to account for these variations and to ensure that a perimeter having a desired minimum circumference is achieved, SOI devices are typically designed with anchor perimeters that are significantly larger than would be necessary if etching were more predictable. However, the use of a perimeter that is larger than necessary is undesirable in that it increases the overall die area, and also leads to larger parasitic capacitance between the anchor and the substrate.

One solution to this problem has been proposed in commonly assigned U.S. patent application Ser. No. 10/238,062 (O'Brien et al.) filed on Sep. 9, 2002. That reference describes a method for creating a MEMS structure in which a first trench is created in the SOI structure which extends through the silicon layer and the sacrificial layer and which separates the sacrificial layer into a first region enclosed by the first trench and a second region exterior to the first trench. A first material is deposited into the first trench such that the first material fills the first trench to a depth at least equal to the thickness of the sacrificial layer. A second trench is created exterior to the first trench which extends through at least the silicon layer and exposes at least a portion of the second region of the sacrificial layer. The second region of the sacrificial layer is then contacted, by way of the second trench, with a chemical etching solution which is adapted to etch the sacrificial layer and which is selective to the first material. Since the material disposed in the first trench acts as a barrier to the etch, the timing of the etch is no longer critical, and MEMS structures may be produced through this approach which have anchor portions that do not vary significantly from one batch to another. Consequently, the anchor perimeter can be minimized, thereby minimizing parasitic capacitance and resulting in a reduction in die size.

While the methodology of O'Brien et al. is a notable advancement in the art, its use nonetheless has some disadvantages in certain applications. In particular, the approach of O'Brien et al. relies on deep reactive ion etching (RIE) of both the device silicon and the sacrificial layer to form the anchor portion of the device. However, the etch rate of the sacrificial layer at the bottom of a deep and narrow trench extending all the way through the device layer is rather slow. While a wet etch could be used to etch the portion of the sacrificial layer at the bottom of the trench, the undercut typically caused by such an etch would result in undesirable void formation in the anchor area during backfill of the trench. The approach of O'Brien et al. also results in a device in which the anchor material is a different material than the single crystal silicon used in the device layer, which makes it more difficult to integrate with CMOS devices and other such structures.

There is thus a need in the art for a method for producing a MEMS structure on a substrate, and particularly from an SOI wafer, such that the perimeter of the anchor portion of the structure (and hence the wafer size) can be minimized, is not affected by variations in etch rates, and does not vary significantly from one product batch to another. There is also a need in the art for a method for producing a MEMS structure, and particularly for forming an anchor portion thereof, that does not require reactive ion etching of the sacrificial layer at the bottom of a trench extending through the device layer thickness. These and other needs are met by the methodologies and devices disclosed herein and hereinafter described.

SUMMARY OF THE INVENTION

In one aspect, the present invention relates to a method for creating a semiconductor structure such as a MEMS structure. In accordance with the method, an article is provided which comprises a substrate and a single crystal semiconductor layer (such as, for example, single crystal silicon) and which has a sacrificial layer comprising a first dielectric material disposed between the substrate and the semiconductor layer. An opening is created which extends through the semiconductor layer and the sacrificial layer and which exposes a portion of the substrate. An anchor portion is then formed in the opening. The anchor portion comprises a second dielectric material, and may comprise at least a first and second layer, wherein the first layer comprises the second dielectric material, and wherein the second layer comprises a material which is preferably conductive, such as polysilicon. The second dielectric material is preferably silicon nitride, and even more preferably silicon rich silicon nitride, and is preferably diverse from the first dielectric material. The step of forming the anchor portion may comprise the steps of depositing the second dielectric material over the semiconductor layer such that the opening is filled, and etching the second dielectric material down to the semiconductor layer. The semiconductor layer is then epitaxially grown to a suitable device thickness, thereby forming a device layer. The device layer preferably covers the anchor portion, and the surface of the device layer preferably comprises single crystal silicon. The method may further comprise the steps of forming a semiconductor structure from the device layer, and removing at least a portion of the sacrificial layer, thereby releasing the semiconductor structure. The step of removing at least a portion of the sacrificial layer may include the steps of creating a second opening which exposes a portion of the sacrificial layer, and contacting the sacrificial layer, by way of the second opening, with an etchant (such as an aqueous solution of HF) which is selective to the material of the anchor portion. The released semiconductor structure may be a MEMS structure, and may comprise an anchor area, a proof mass area, a moving finger, and a fixed finger.

In another aspect, a method for creating a semiconductor structure, such as a MEMS structure, is provided. In accordance with the method, an article is provided which comprises a substrate and a single crystal semiconductor layer and which has a sacrificial layer comprising a first dielectric material which is disposed between the substrate and the semiconductor layer. An anchor portion is then formed which comprises a second dielectric material. The second dielectric material is preferably silicon nitride, and even more preferably is silicon rich silicon nitride. The anchor portion is in contact with the substrate and extends through the semiconductor layer and the sacrificial layer. The semiconductor layer is then epitaxially grown to a suitable device thickness, thereby forming a device layer. The device layer preferably covers the anchor portion and has a surface which comprises single crystal silicon. A semiconductor structure is then formed in the device layer, and at least a portion of the sacrificial layer is removed with an etchant. The etchant, which may comprise an aqueous HF solution, is preferably selective to the second dielectric material.

In still another aspect, a method for creating a semiconductor structure, such as a MEMS structure, is provided. In accordance with the method, an article is provided which comprises a substrate and a single crystal semiconductor layer and which has a sacrificial layer comprising a dielectric material which is disposed between the substrate and the semiconductor layer. A first trench is created which extends through the semiconductor layer and the sacrificial layer. Silicon nitride is then deposited into the first trench, and a semiconductor structure is formed in the semiconductor layer. A second trench is then created which contacts the sacrificial layer, and the sacrificial layer is contacted by way of the second trench with a solution that etches the sacrificial layer and that is selective to silicon nitride and to the semiconductor layer.

In yet another aspect, an inertial sensor is provided. The sensor includes an anchor comprising a base having at least one support structure depending therefrom which is in contact with the substrate. The support structure comprises silicon nitride, and may comprise a plurality of concentric walls comprising silicon nitride, the walls having a portion of silicon oxide disposed between them. The portion of the base directly overlying the support structure comprises single crystal silicon. The sensor has a proof mass supported by the anchor portion, and the proof mass has a first set of spaced-apart, elongated fingers projecting therefrom. The sensor also includes a second set of spaced-apart, elongated fingers, and further includes a spring which connects the proof mass to the base of the anchor such that the first and second set of fingers interdigitate.

These and other aspects are described in further detail below.

DETAILED DESCRIPTION

Figure 1:
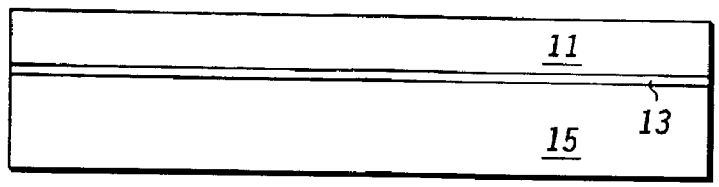
FIGS. 1–3 are illustrations of a prior art method for making a MEMS structure.
Figure 2:
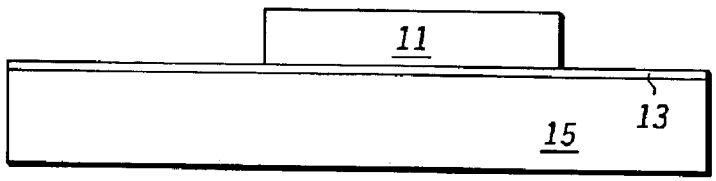
Figure 3:
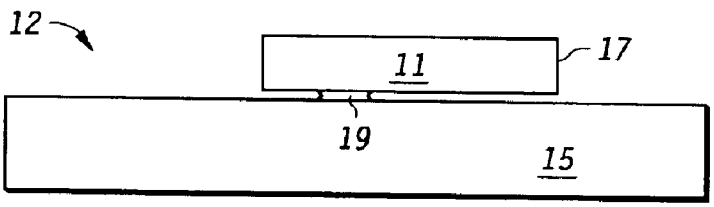

As used herein, the term "epitaxial growth" refers to a process whereby an article is placed in a reactor and subjected to conditions in which single crystal silicon will grow on any exposed single crystal surfaces of the device. The process may also result in the growth, at least initially, of polycrystalline silicon on exposed surfaces of the device which are polycrystalline in nature.

It has now been discovered that an anchor portion of a MEMS device or other semiconductor structure may be formed without the need for reactive ion etching of the sacrificial layer at the bottom of a trench extending through the device layer thickness. This may be accomplished by forming the part of the anchor portion that extends through the sacrificial layer, before total device layer thickness is achieved. Thus, for example, the anchor portion may be at least partially formed in an SOI wafer comprising a substrate and a thin single crystal semiconductor layer and having a sacrificial layer comprising a first dielectric material disposed between the substrate and the semiconductor layer. After the anchor portion is formed, the thin single crystal semiconductor layer may be grown to the desired device thickness.

It has also been discovered that a MEMS device or other semiconductor structure may be formed on a substrate, and particularly from an SOI wafer, such that the perimeter of the anchor portion of the structure (and hence the wafer size) can be minimized, is not affected by variations in etch rates, and does not vary significantly from one product batch to another, by protecting the anchor portion during release by one or more materials which are resistant to the etch used to achieve release of the structure. In the case of an SOI device, for example, this may be accomplished by forming the anchor portion of the structure at least partially out of an anchor material such as silicon nitride, and then releasing the structure with a release agent, such as an aqueous solution of HF, that is selective to the anchor material. Since the anchor material is resistant to the etch, anchor size is not affected by variations in etch rates, and does not vary significantly from one product batch to another. Consequently, there is no need to factor variations in etch rates into the anchor size. Therefore, anchor size may be minimized, thus reducing the overall size of the device. The reduction in anchor size also has the benefit of reducing parasitic capacitance.

The methodologies described herein may be understood with reference to FIGS. 4–10. The device depicted in these figures is a hypothetical MEMS device, the relevant features of which have been consolidated into a single cross-section so that the effect of each processing step on these features will be evident from a single figure. It is to be understood, however, that in an actual MEMS device, these features may not all appear in any single cross-section of the device. This point may be further appreciated with reference to FIG. 11, which illustrates a design for an actual MEMS device that may be made in accordance with the methodologies described herein.

Figure 4:
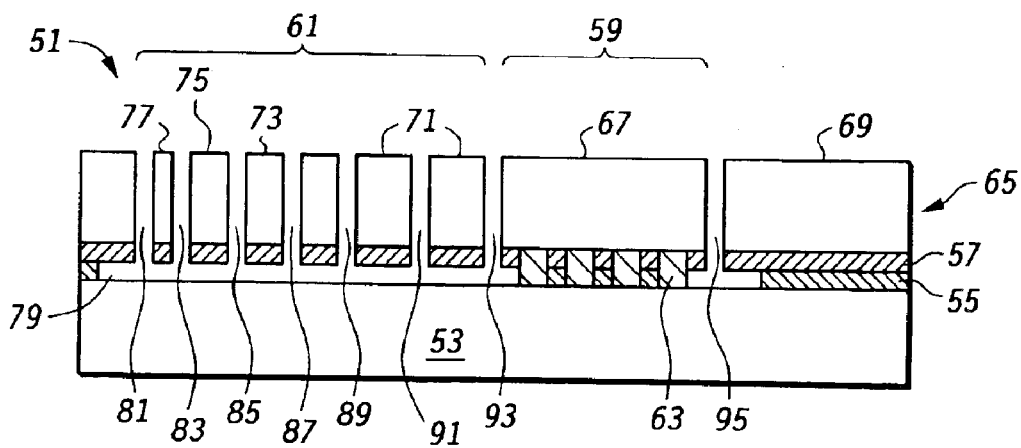
FIG. 4 is an illustration of a MEMS device made in accordance with the teachings herein.

FIG. 4 illustrates a MEMS device 51 made in accordance with the teachings herein. The device is created on a substrate comprising a silicon wafer 53, a sacrificial layer 55 and a single crystal semiconductor layer 57, and has an anchor portion 59 and a suspended portion 61. The anchor portion in the particular device depicted is equipped with a plurality of nitride anchors 63. The device has an epitaxially grown device layer 65 which is epitaxial polysilicon in the areas 67 over the nitride anchors, and which is single crystal silicon 69 elsewhere.

The area 67 may also consist essentially of single crystal silicon if the epitaxial overgrowth is made to occur laterally. This may occur, for example, if the rate of growth of single crystal silicon growing vertically and laterally from the portions of the semiconductor layer 105 adjacent to the nitride anchors 109 is greater than the rate of growth of polysilicon growing vertically from the nitride anchors 109. It is desirable for the area 67 to be single crystal silicon because the resulting surface will typically be planar. By contrast, if the polysilicon in the areas over the nitride anchors is allowed to grow to the surface of the device layer, a non-planar surface may result. A non-planar surface is undesirable in that the fine line lithography commonly used to develop surface features on the device has limited depth focus.

The device is equipped with a proof mass area 71, at least one moving finger 73, at least one fixed finger 75, and a spring suspension 77. Release of the structure is accomplished through the creation of horizontal trench 79 by introducing an etchant into vertical trenches 81, 83, 85, 87, 89, 91, 93 and 95.

Figure 5:
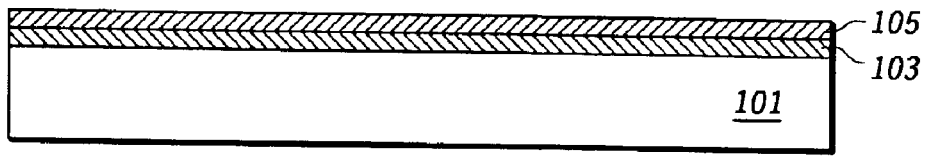
FIGS. 5–10 are illustrations depicting the methodology used to achieve the device of FIG. 4.
Figure 6:
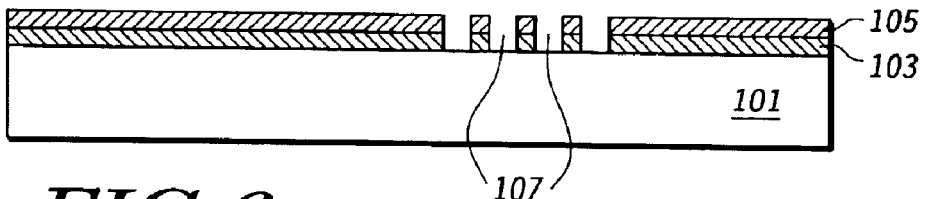

FIGS. 5–10 illustrate the methodology used to achieve the structure depicted in FIG. 4. As shown in FIG. 5, the process begins with an SOI wafer 101 which has a silicon dioxide sacrificial layer 103 disposed thereon, and a thin semiconductor layer 105, preferably comprising active single-crystalline silicon, disposed on the buried oxide layer. The thin semiconductor layer is preferably less than 10 microns thick, more preferably less than 7 microns thick, and most preferably within the range of about 0.1 to about 0.5 microns thick. In some embodiments, a thin oxide layer (not shown) may be disposed on top of the semiconductor layer 105. The wafer is then patterned and etched as shown in FIG. 6 to define a series of trenches 107 which extend through the semiconductor layer 105 and the sacrificial layer 103. The etching used to define the trenches 107 is typically a reactive ion etch (RIE) and is carefully controlled to achieve trenches having openings of predetermined size.

Figure 7:
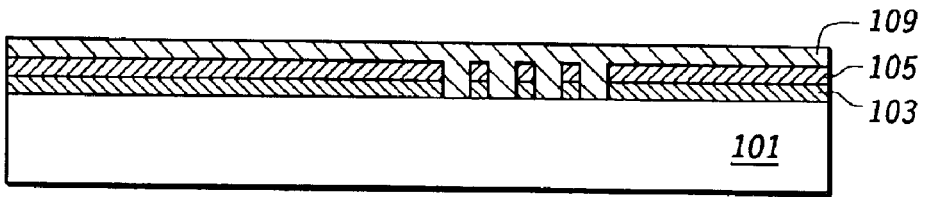

As shown in FIG. 7, a layer of anchor material 109 is then deposited over the structure. The thickness of the anchor material is controlled to completely fill the trenches. The use of silicon rich silicon nitride as the anchor material is advantageous herein because this material has very low stress. Thus, relatively thick layers (about 1 micron) of silicon rich silicon nitride can be deposited, if so desired, without cracking or delamination. Moreover, silicon rich silicon nitride has a very low etch rate, compared to that of typical sacrificial oxide layers, in HF solutions (about 80 Å/min in 49% HF solutions) commonly used to release MEMS structures on SOI wafers. Hence, the amount of undercut of the nitride anchor is very small compared to the undercut of the sacrificial layer.

In some applications, more than one anchor material may also be used. Hence, for example, the anchor material may be deposited as at least a first and second layer, wherein the first layer comprises a first material such as silicon nitride, and wherein the second layer comprises a second material, such as polysilicon, which is diverse from the first material.

Figure 8:
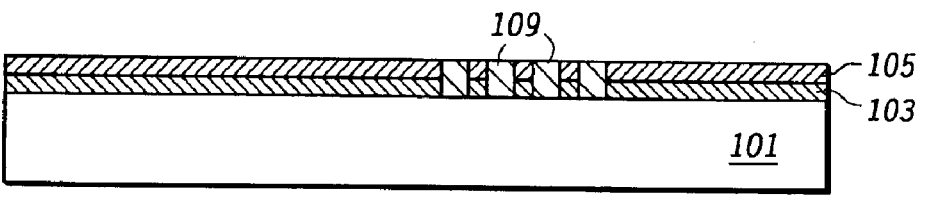

As indicated in FIG. 8, the layer of anchor material 109 is then etched down to the semiconductor layer 105. The etch used in this step is preferably either a wet etch or a partial RIE. If a partial RIE is used, it is preferably followed by a wet etch so as to minimize damage to the semiconductor layer. Alternatively, a thin oxide layer may be added to the top of the semiconductor layer in the structure of FIG. 6 prior to the formation of the trenches 107 therein, and this thin oxide layer may be used as an etch stop in the etch used to remove the layer of anchor material 109 in FIG. 8. The thin oxide layer may then be stripped with a wet etch, thus avoiding any damage to the underlying semiconductor layer 105.

Figure 9:
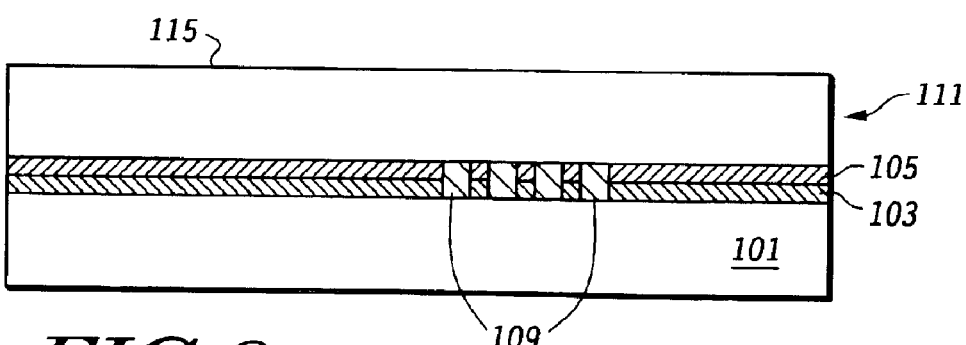

As shown in FIG. 9, a layer of silicon 111 is epitaxially grown over the device to the desired device thickness. In portions of the layer of silicon overlying the anchor portion of the device, the anchor material 109 seeds the growth of polysilicon, while in the remainder of the device, the underlying semiconductor layer 105 seeds the growth of single crystal silicon. However, the layer of silicon over the anchor portion may also be grown as single crystal silicon if the epitaxial overgrowth is made to occur laterally from portions of the semiconductor layer 105 adjacent to the anchor material at a faster rate than the epitaxial growth of polysilicon seeded by the anchor material 109.

Figure 10:
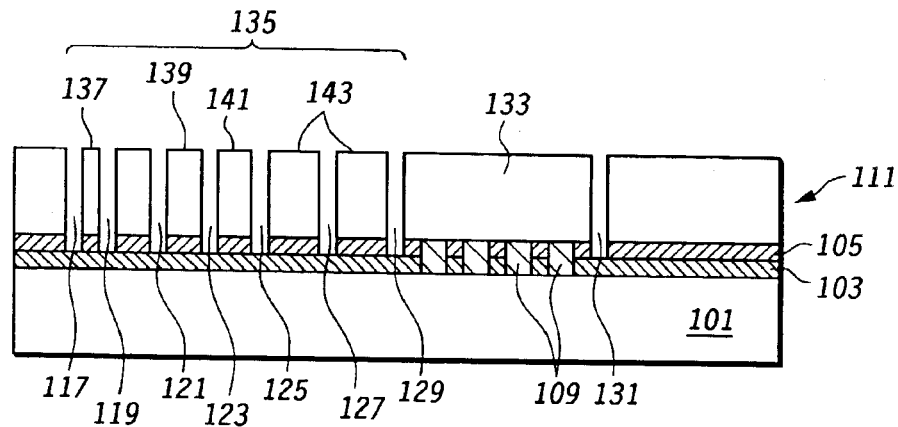

FIG. 10 depicts the completed structure prior to release. Deep RIE is used to create a series of trenches 117, 119, 121, 123, 125, 127, 129, and 131 which extend down to the sacrificial layer 103 and which define the anchor portion 133 and the suspended portion 135 of the device. The suspended portion of the device consists of a spring suspension 137 and a proof mass area 143. The fixed finger 139 and the moving finger 141 may also be released. Release of the structure may then be achieved through an oxide etch of the sacrificial layer to achieve the structure shown in FIG. 4. This oxide etch may be achieved, for example, with an aqueous HF solution. Since the anchor material is chosen to be resistant to the oxide etch, the perimeter of the anchor portion of the structure (and hence the wafer size) can be minimized, is not affected by variations in etch rates, and does not vary significantly from one product batch to another.

Figure 11:
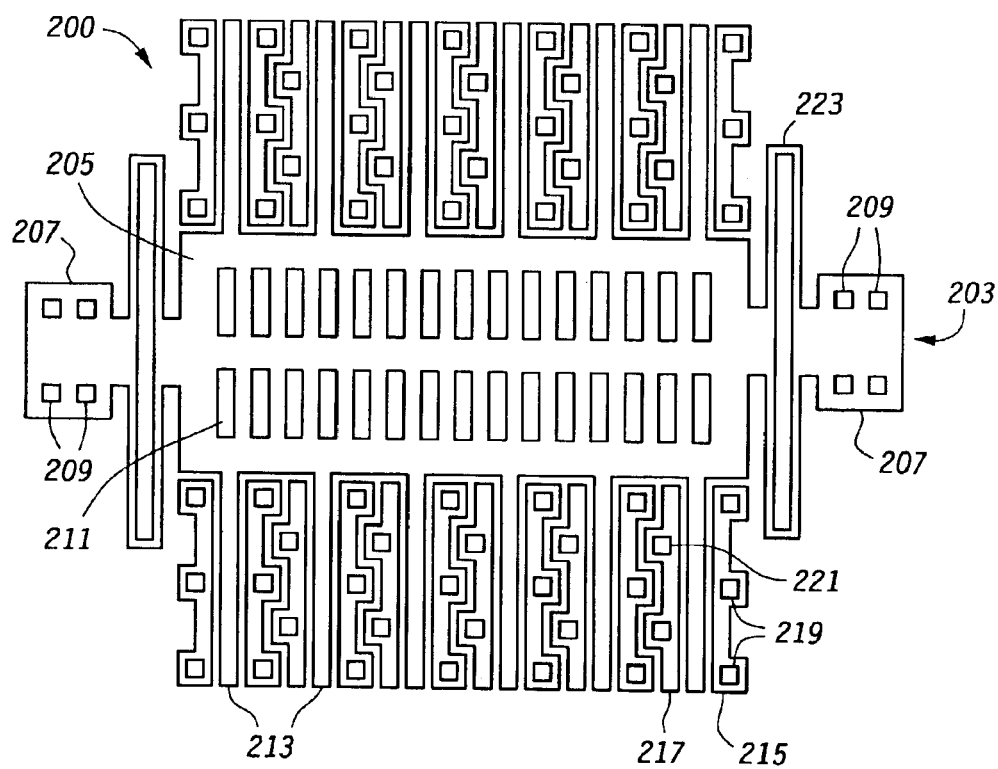
FIG. 11 is an illustration of a MEMS device made in accordance with the teachings herein.

FIG. 11 illustrates one possible design for a MEMS device (in this case, an accelerometer) that can be made using the methodologies described herein, it being understood that a wide variety of other designs and devices are achievable with these methodologies. The device 200 has a proof mass area 203 with a suspended portion 205 and an anchored portion 207. The anchored portion is attached to a substrate (not shown) by a plurality of proof mass anchors 209. The suspended portion has a plurality of etch holes 211 therein and is equipped with a plurality of moving fingers 213. Each of the moving fingers is disposed between first 215 and second 217 fixed fingers, which are anchored by first 219 and second 221 sets of anchor fingers, respectively. A spring 223 is disposed between the suspended portion and the anchored portion of the device. Various etchants may be used in the methodologies described herein. The choice of etchants will depend on various factors, such as the composition of the substrate, sacrificial layer or semiconductor layer, the composition of components or features present on the article at the time of etch, and the selectivity of a prospective etch. Preferably, the etchant is an aqueous HF solution, although the etchant may also be HF with various concentrations of acetic acid. These materials may be used as aqueous or organic solvent based solutions, and the solutions may be buffered. In some applications, vapor phase HF may also be used to effect release of the semiconductor structure. Methods have been provided herein for producing a MEMS structure on a substrate, and particularly on an SOI wafer, in which the suspended portion of the structure is protected during release by one or more materials which are resistant to the etch used to achieve release of the structure. The anchor portion of the structure may likewise comprise one or more materials which are resistant to the etch used to achieve release of the structure. These methods allow the undercut distance to be increased without any adverse effects on the structural features of the device, thus allowing the overall size of the device to be reduced. These methods also allow the perimeter of the anchor (and hence the wafer size) to be minimized, and further ensure that the anchor perimeter does not vary significantly from one product batch to another.

The above description of the invention is illustrative, and is not intended to be limiting. It will thus be appreciated that various additions, substitutions and modifications may be made to the above described embodiments without departing from the scope of the present invention. Accordingly, the scope of the present invention should be construed solely in reference to the appended claims.

What is claimed is:

1. A method for creating a semiconductor structure, comprising the steps of:
   providing an article comprising a substrate and a single crystal semiconductor layer and having a sacrificial layer comprising a first dielectric material disposed between the substrate and the semiconductor layer;
   creating an opening which extends through the semiconductor layer and the sacrificial layer and which exposes a portion of the substrate;
   forming an anchor portion in the opening, the anchor portion comprising a second dielectric material; and
   epitaxially growing the semiconductor layer, thereby forming a device layer.

2. The method of claim 1, wherein the step of forming the anchor portion comprises the steps of:
   depositing the second dielectric material over the semiconductor layer such that the opening is filled; and
   etching the second dielectric material down to the semiconductor layer.

3. The method of claim 1, wherein the second dielectric material comprises silicon nitride.

4. The method of claim 3, wherein the silicon nitride is a silicon-rich silicon nitride.

5. The method of claim 1, wherein the device layer covers the anchor portion.

6. The method of claim 1, wherein the device layer covers the anchor portion and wherein the surface of the device layer comprises single crystal silicon.

7. The method of claim 1, wherein the semiconductor layer comprises single crystal silicon.

8. The method of claim 1, further comprising the steps of:
   forming a semiconductor structure in the device layer; and
   removing at least a portion of the sacrificial layer, thereby releasing the semiconductor structure.

9. The method of claim 8, wherein the step of removing at least a portion of the sacrificial layer includes the steps of:
   creating a second opening which exposes a portion of the sacrificial layer; and
   contacting the sacrificial layer, by way of the second opening, with an etchant.

10. The method of claim 9, wherein the etchant is selective to the material of the anchor portion.

11. The method of claim 9, wherein the etchant is an aqueous solution of HF.

12. The method of claim 8, wherein the released semiconductor structure comprises an anchor area, a proof mass area, a moving finger, and a fixed finger.

13. The method of claim 8, wherein the released semiconductor structure is a MEMS structure.

14. The method of claim 1, wherein the first and second dielectric materials are diverse.

15. The method of claim 1, wherein the anchor portion comprises at least a first and second layer, wherein the first layer comprises the second dielectric material, and wherein the second layer comprises a material which is diverse from the second dielectric material.

16. The method of claim 15, wherein the second layer comprises a material which is conductive.

17. A method for creating a semiconductor structure, comprising the steps of:
   providing an article comprising a substrate and a single crystal semiconductor layer and having a sacrificial layer comprising a first dielectric material which is disposed between the substrate and the semiconductor layer;
   forming an anchor portion comprising a second dielectric material which is in contact with the substrate and which extends through the semiconduotor layer and the sacrificial layer;
   epitaxially growing the semiconductor layer over the anchor portion, thereby forming a device layer;
   forming a semiconductor structure in the device layer; and
   removing at least a portion of the sacrificial layer with an etchant.

18. The method of claim 17, wherein the etchant is selective to the second dielectric material.

19. The method of claim 17, wherein the second dielectric material comprises silicon nitride.

20. The method of claim 17, wherein the silicon nitride is silicon rich silicon nitride.

21. The method of claim 17, wherein the etchant comprises an aqueous HF solution.

22. The method of claim 17, wherein the step of removing at least a portion of the sacrificial layer with an etchant causes the release of the semiconductor structure, and wherein the released semiconductor structure is a MEMS structure.

23. The method of claim 17, wherein the surface of the device layer consists essentially of single crystal silicon.

24. A method for creating a semiconductor structure, comprising the steps of:
   providing an article comprising a substrate and a single crystal semiconductor layer and having a sacrificial layer comprising a first dielectric material disposed between the substrate and the semiconductor layer;
   creating an opening which extends through the semiconductor layer and the sacrificial layer and which exposes a portion of the substrate;
   depositing a second dielectric material in the opening, thereby forming an anchor portion; and
   epitaxially growing the semiconductor layer, thereby forming a device layer.

25. The method of claim 24, wherein the step of epitaxially growing the semiconductor layer results in the anchor portion being covered by the semiconductor layer.

26. The method of claim 24, wherein the step of depositing a second dielectric material in the opening results in the opening being essentially filled.

27. The method of claim 24, wherein the step of forming the anchor portion comprises the steps of:
depositing the second dielectric material over the semiconductor layer such that the opening is filled; and
etching the second dielectric material down to the semiconductor layer.

28. The method of claim 24, wherein the second dielectric material comprises silicon nitride.

29. The method of claim 28, wherein the silicon nitride is a silicon-rich silicon nitride.

30. The method of claim 24, wherein the device layer covers the anchor portion.

31. The method of claim 24, wherein the device layer covers the anchor portion and wherein the surface of the device layer comprises single crystal silicon.

32. The method of claim 24, wherein the semiconductor layer comprises single crystal silicon.

33. The method of claim 24, further comprising the steps of:
forming a semiconductor structure in the device layer; and
removing at least a portion of the sacrificial layer, thereby releasing the semiconductor structure.

34. The method of claim 33, wherein the step of removing at least a portion of the sacrificial layer includes the steps of:
creating a second opening which exposes a portion of the sacrificial layer; and
contacting the sacrificial layer, by way of the second opening, with an etchant.

35. The method of claim 34, wherein the etchant is selective to the material of the anchor portion.

36. The method of claim 34, wherein the etchant is an aqueous solution of HF.

37. The method of claim 33, wherein the released semiconductor structure comprises an anchor area, a proof mass area, a moving finger, and a fixed finger.

38. The method of claim 33, wherein the released semiconductor structure is a MEMS structure.

39. The method of claim 24, wherein the first and second dielectric materials are diverse.

40. The method of claim 24, wherein the anchor portion comprises at least a first and second layer, wherein the first layer comprises the second dielectric material, and wherein the second layer comprises a material which is diverse from the second dielectric material.

41. The method of claim 40, wherein the second layer comprises a material which is conductive.

* * * * *